US008523080B2

(12) United States Patent
Lien (10) Patent No.: US 8,523,080 B2
(45) Date of Patent: Sep. 3, 2013

(54) MEMORY CARD PACKAGE STRUCTURE AND METHOD FOR FABRICATING THE SAME

(75) Inventor: Wen-Hsiang Lien, Jhunan Township, Maioli County (TW)

(73) Assignee: Aptos Technology Inc., Hsin-Chu (TW)

( * ) Notice: Subject to any disclaimer, the term of this patent is extended or adjusted under 35 U.S.C. 154(b) by 176 days.

(21) Appl. No.: 13/196,144

(22) Filed: Aug. 2, 2011

(65) Prior Publication Data

US 2012/0061474 A1      Mar. 15, 2012

(30) Foreign Application Priority Data

Sep. 14, 2010   (TW) ................................. 99131007 A (51) Int. Cl.
*G06K 19/06*         (2006.01)
(52) U.S. Cl.
USPC ........................................... 235/492; 235/487
(58) Field of Classification Search
USPC ................... 235/492, 380, 487, 488
See application file for complete search history.

(56) References Cited

U.S. PATENT DOCUMENTS

| 4,737,789 | A | * | 4/1988 | Nysen | 342/51 |
| 5,959,289 | A | * | 9/1999 | Okada et al. | 235/487 |
| 7,404,522 | B2 | * | 7/2008 | Kawai | 235/492 |
| 7,530,491 | B2 | * | 5/2009 | Lasch et al. | 235/380 |

* cited by examiner

*Primary Examiner* — Daniel St. Cyr
(74) *Attorney, Agent, or Firm* — Muncy, Geissler, Olds & Lowe, PLLC (57) ABSTRACT

A memory card package structure includes a substrate having an antenna module; a first and second magnetic waveguiding layers respectively disposed on an upper surface and a lower surface of the substrate; a chip disposed on the first magnetic waveguiding layer and electrically connected with the substrate; and an encapsulation body encapsulating the chip, the first magnetic waveguiding layer and the upper surface of the substrate. A method for fabricating the memory card package structure is also provided. By directly disposing magnetic waveguiding material in the package structure, the thickness of the package structure is retained and yet the signal of an antenna module in the memory card package structure can be directed out along a horizontal direction, thereby extending the signal transmission distance.

10 Claims, 7 Drawing Sheets

MEMORY CARD PACKAGE STRUCTURE AND METHOD FOR FABRICATING THE SAME

BACKGROUND OF THE INVENTION

1. Field of the Invention

The present invention relates to a packaging technology for a memory card, and more particularly to a memory card package structure and the method for fabricating the same.

2. Description of the Prior Art

With the continuing advances in digital products such as digital cameras, mobile phones, personal digital assistants, and audio/video players, a product with enhanced functionalities and a reduced volume has become a necessity in consumers' daily life. Memory cards for storing data are one of the main contributors in maximizing the functions of such a product.

With the rapid growth in functionalities of computer and network communication products, the demands to be versatile, mobile, small volume and light weight for a product are inevitable. Therefore, it is our persistent goal to increase the capacity, reduce the size and enhance the versatility of a memory card structure design.

SUMMARY OF THE INVENTION

The present invention is directed to a memory card package structure and its fabrication method. By directly disposing magnetic waveguiding material in the package structure, the thickness of the package structure is retained and yet the signal of an antenna module in the memory card package structure can be directed out along a horizontal direction, thereby extending the signal transmission distance.

In one aspect of the present invention, the memory card package structure includes a substrate including an antenna module; a first magnetic waveguiding layer disposed on an upper surface of the substrate and covers at least the antenna module; a chip disposed on the first magnetic waveguiding layer and electrically connected with the substrate; an encapsulation body for encapsulating the chip, the first magnetic waveguiding layer and the upper surface of the substrate; and a second magnetic waveguiding layer disposed on a lower surface of the substrate, wherein the first magnetic waveguiding layer and the second magnetic waveguiding layer are disposed at positions such that they cover the location span of the antenna module.

In another aspect of the present invention, the fabrication method for the memory card package structure includes the steps of: providing a substrate, wherein the substrate includes an antenna module; disposing a first magnetic waveguiding layer on an upper surface of the substrate such that the first magnetic waveguiding layer covers at least the antenna module; disposing a chip on the first magnetic waveguiding layer and electrically connecting the chip with the substrate; forming an encapsulation body encapsulating the chip, the first magnetic waveguiding layer and the upper surface of the substrate; and disposing a second magnetic waveguiding layer on a lower surface of the substrate, wherein the first magnetic waveguiding layer and the second magnetic waveguiding layer are disposed at positions such that they cover at least the location span of the antenna module.

The objective, technologies, features and advantages of the present invention will become more apparent from the following description in conjunction with the accompanying drawings, wherein certain embodiments of the present invention are set forth by way of illustration and examples.

DESCRIPTION OF THE PREFERRED EMBODIMENT

The detail description is provided below. The preferred embodiments described are only for the purpose of description and illustration, not for the limiting the present invention.

Figure 1:
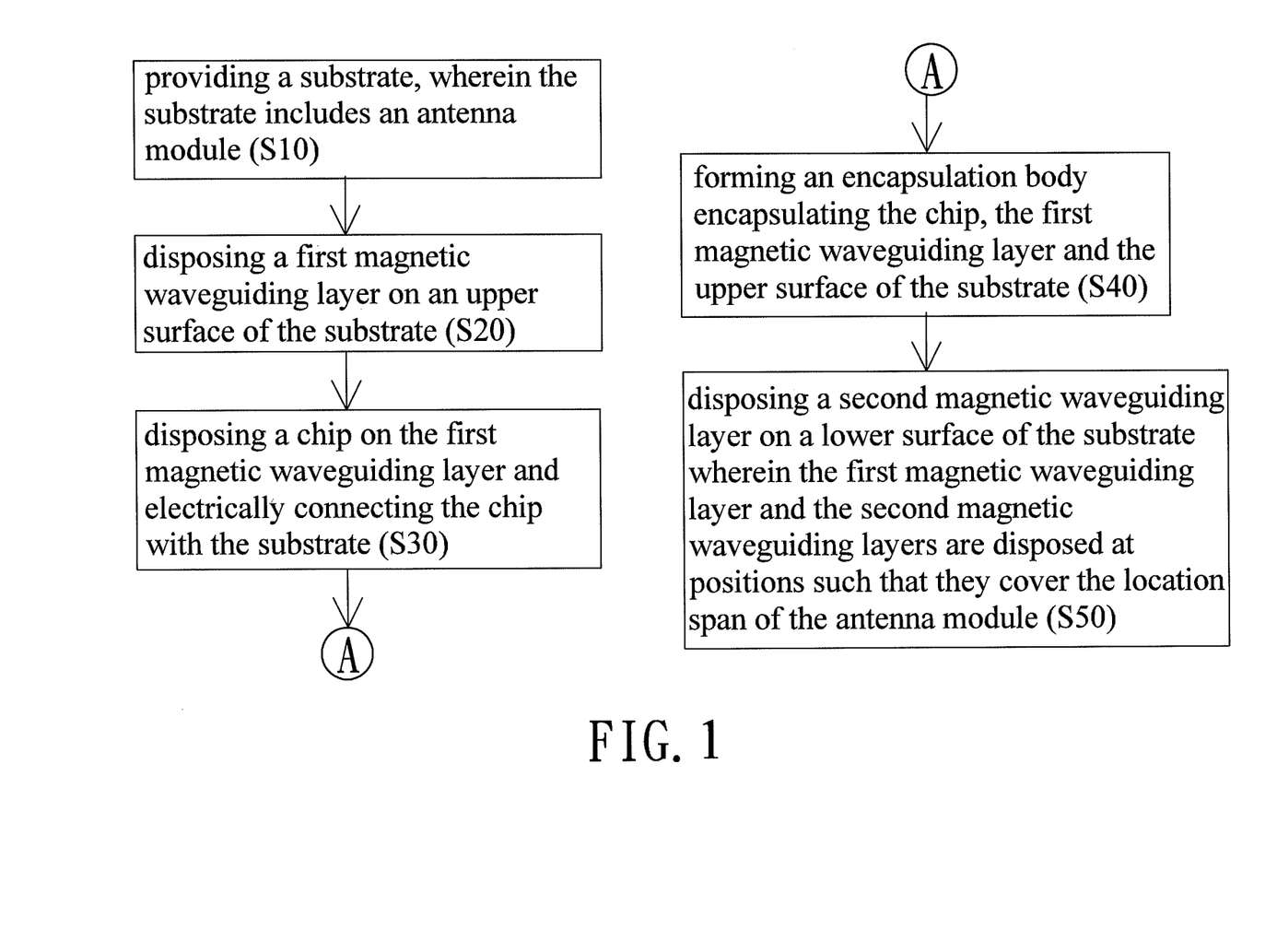
FIG. 1 is a flow diagram illustrating the method for fabricating the memory card package structure according to an embodiment of the present invention.

Referring to FIG. 1, there is shown a flow diagram of a method for fabricating a memory card package structure according to an embodiment. As illustrated in the figure, first, a substrate is provided (step S10), wherein the substrate includes an antenna module which can be disposed such that it emerges at an upper surface of the substrate or such that it is embedded inside the substrate. Then, a first magnetic waveguiding layer is disposed on the upper surface of the substrate (step S20). Thereafter, a chip is disposed on the first magnetic waveguiding layer and is electrically connected with the substrate (step S30). Next, an encapsulation body is formed to encapsulate the chip, the first magnetic waveguiding layer and the upper surface of the substrate (step S40). Finally, a second magnetic waveguiding layer is disposed on a lower surface of the substrate, wherein the first magnetic layer and the second magnetic layer are disposed at positions such that they cover the location span of the antenna module (step S50). According to an embodiment, the first magnetic waveguiding layer and the second magnetic waveguiding layer have adhesive layers so that they can be adhesively attached to the substrate.

Continuing the above description, the fabrication method according to another embodiment may also form the first magnetic waveguiding layer and the second magnetic waveguiding layer on the substrate at the same time to consolidate the fabrication steps. Under the fabrication process of the present invention, a magnetic waveguiding layer is directly disposed inside the package structure; as a result, not only the thickness of the structure is not increased, but the two magnetic waveguiding layers may cooperatively work to limit the signal radiation direction of the antenna module.

Figure 2:
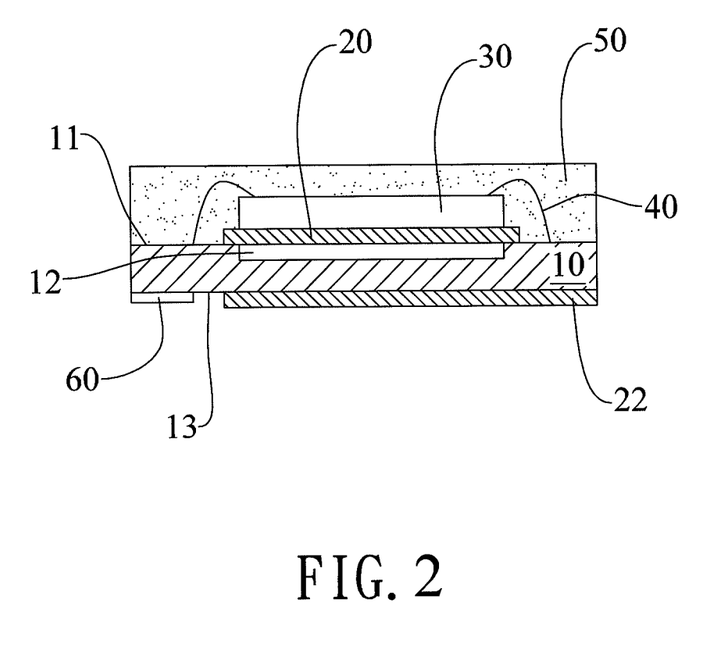
FIG. 2 is a sectional view diagram illustrating the memory card package structure according to an embodiment of the present invention.

Referring to FIG. 2, there is illustrated a sectional view of a memory card package structure according to an embodiment. Such structure can be but is not limited to be fabricated according to the aforementioned fabrication method. As shown in the figure, the memory card package structure includes: a substrate 10 including an antenna module 12; a first magnetic waveguiding layer 20 disposed on an upper surface 11 of the substrate 10, and covers at least the antenna module 12; a chip 30 disposed on the first magnetic waveguiding layer 20 and electrically connected with the substrate 10; and a second magnetic waveguiding layer 22 disposed on a lower surface 13 of the substrate 10, wherein the first magnetic waveguiding layer 20 and the second magnetic waveguiding layer 22 are disposed at positions where they can cover the location span of the antenna module 12. In this way, a signal of the antenna module 12 is directed out along a horizontal direction of the memory card package structure thereby extending the signal transmission distance of the antenna module 12. The antenna module 12 here can be disposed such that it emerges at an upper surface 11 of the substrate 10 or such that it is embedded inside the substrate 10. In this embodiment, the antenna module 12 is disposed such that it emerges at the upper surface 11 of the substrate 10. By way of example, the chip 30 may be an NFC chip (near field communication chip), or an RFID chip. Also, in this embodiment, the chip 30 is electrically connected with the substrate 10 by way of wire bonding using a plurality of gold wires 40.

Continuing the above description, the memory card package structure according to an embodiment further includes a signal output unit 60 disposed on the lower surface 13 of the substrate 10 and is for output or for receiving data and signal input from an external device. Also, in an embodiment, the second magnetic waveguiding layer 22 may cover the lower surface 13 while exposing only where the signal output unit 60 is disposed to provide better shielding. It can be understood that by arranging the magnetic waveguiding layer 20, 22 on the upper and lower surfaces 11, 13 of the substrate 10 such that they cover the location span of the antenna module 12, they can achieve directing the electromagnetic wave or signal of the antenna module 12 out along a horizontal direction of the memory card package structure without increasing the thickness of the package structure, allowing a designer to attach other standard tapes on the encapsulation body of the memory card and more flexibility in the fabrication process.

Figure 3:
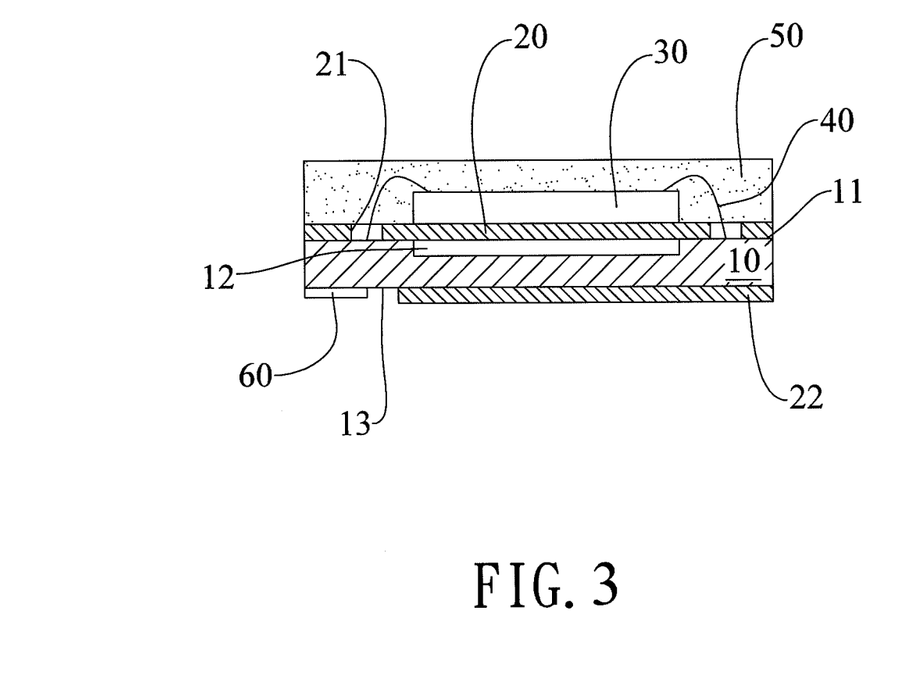
FIG. 3 is a sectional view diagram illustrating the memory card package structure according to another embodiment of the present invention.
Figure 4A:
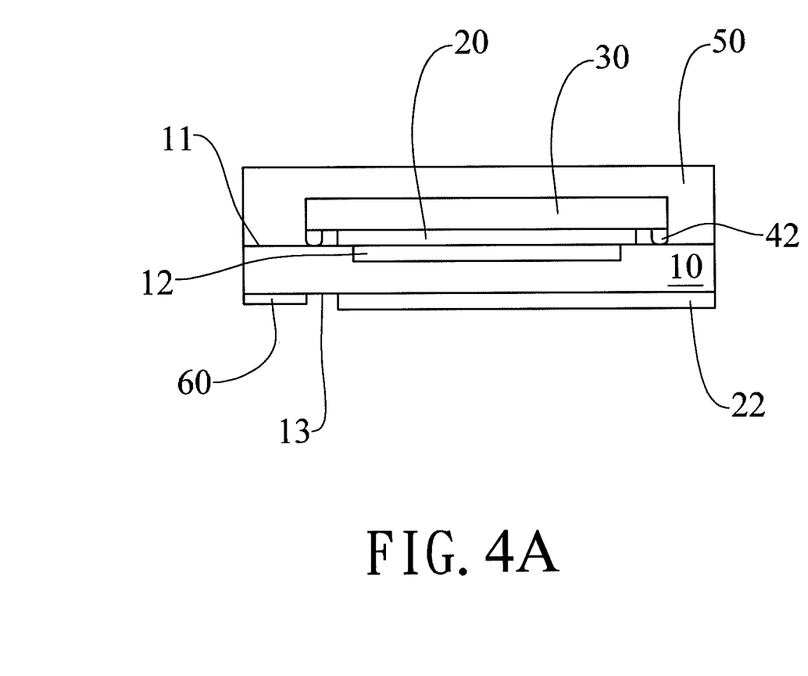
FIG. 4A and FIG. 4B are sectional view diagrams respectively illustrating the memory card package structures according to different embodiments of the present invention.
Figure 4B:
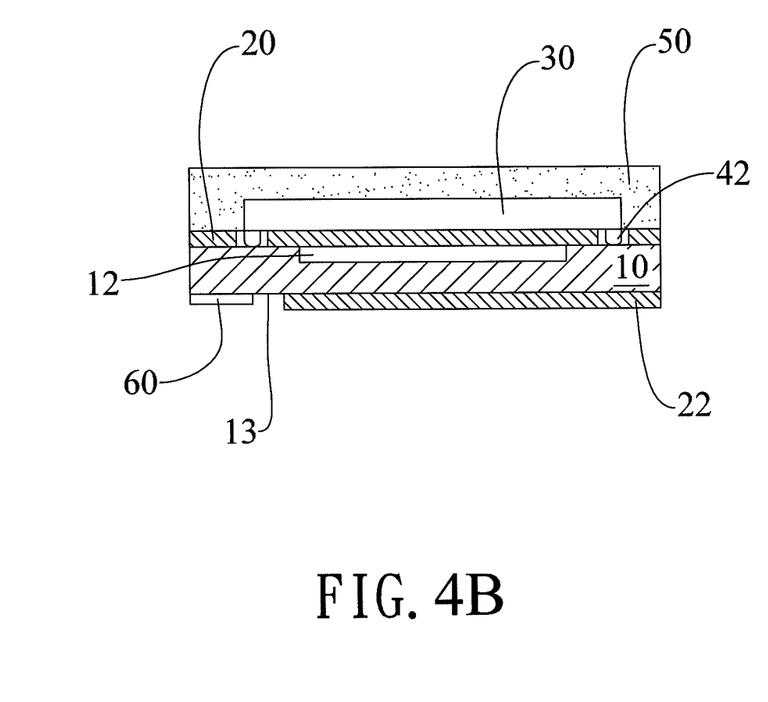

Referring to FIG. 3, there is illustrated an embodiment where the memory card package structure may also include a plurality of holes 21 penetrating the first magnetic waveguiding layer 20 so that the plurality of gold wires 40 may run through the holes 21 to electrically connect the chip 30 with the substrate 10. In this embodiment, the magnetic waveguiding layers create a better waveguiding effect for the antenna module 12 under the large area coverage of the magnetic waveguiding layers. In an embodiment illustrated in FIG. 4A and FIG. 4B, the chip 30 is electrically connected with the substrate 10 by way of flip chip bonding with a plurality of bumps 42. Other parts of the structure are similar to the aforementioned embodiment and the description thereof is omitted here.

Figure 5A:
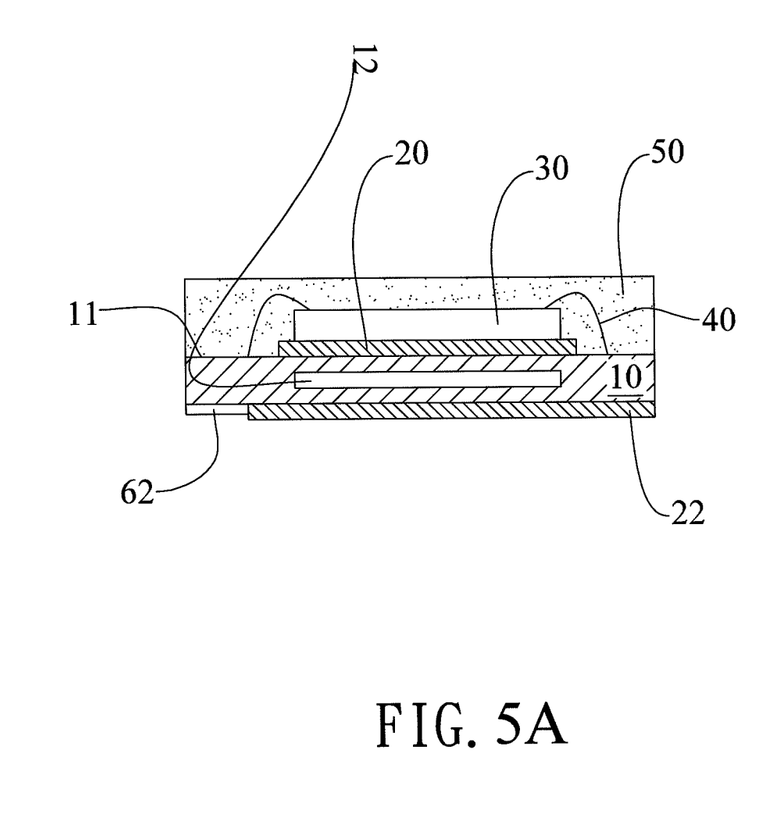
FIG. 5A and FIG. 5B are sectional view diagram and bottom view diagram illustrating the memory card package structure according to yet another embodiment of the present invention.
Figure 5B:
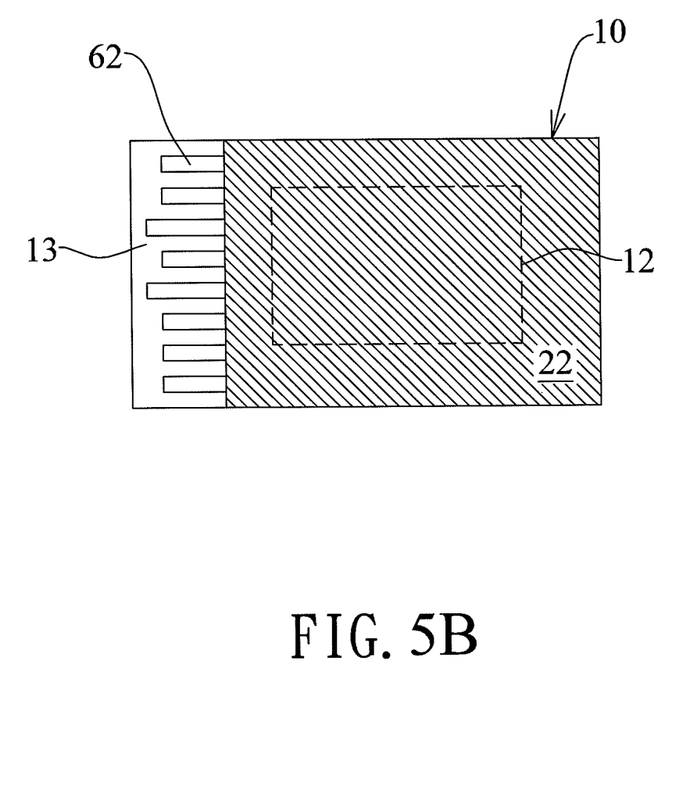

Referring to FIG. 5A and FIG. 5B, there are respectively illustrated a sectional view and a bottom view of a memory card package structure according to another embodiment. As shown in the figures, the memory card package structure include a substrate 10, wherein the substrate includes an antenna module 12 and a plurality of gold fingers 62 disposed on a lower surface 13 of the substrate 10; a first magnetic waveguiding layer 20 disposed on an upper surface 11 of the substrate 10; a second magnetic waveguiding layer 22 disposed on a lower surface of the substrate 10 such that the second magnetic waveguiding layer 22 avoids the location of the gold fingers 62; a chip 30 disposed on the first magnetic waveguiding layer 20 and is electrically connected with the substrate 10; and an encapsulation body 50 for encapsulating the chip 30, the first magnetic waveguiding layer 20 and the upper surface 11 of the substrate 10. As shown in the figures, in this embodiment, the antenna module 12 is embedded inside the antenna module 12. In a preferred embodiment, in order to provide a better waveguiding function, the area of the first magnetic waveguiding layer 20 is greater than or equal to that of the antenna module 12 and so is the second magnetic waveguiding layer 20.

In the foregoing embodiments, the memory card package structure can include but is not limited to include a micro memory card. The structure and the fabrication method of the present invention can be applied to any memory card package structure which has an antenna module.

To summarize the foregoing embodiments, the present invention is directed to a memory card package structure and the method for fabricating the same. By directly disposing magnetic waveguiding material in the package structure, the thickness of the package structure is retained and yet the signal of an antenna module in the memory card package structure can be directed out along a horizontal direction, thereby extending the signal transmission distance.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A memory card package structure comprising:
   a substrate comprising an antenna module;
   a first magnetic waveguiding layer disposed on an upper surface of the substrate and covers at least the antenna module;
   a chip disposed on the first magnetic waveguiding layer and electrically connected with the substrate;
   an encapsulation body for encapsulating the chip, the first magnetic waveguiding layer and the upper surface of the substrate; and
   a second magnetic waveguiding layer disposed on a lower surface of the substrate, wherein the first magnetic waveguiding layer and the second magnetic waveguiding layer are disposed at positions such that they cover the location span of the antenna module.

2. The memory card package structure according to claim 1, wherein the antenna module is disposed such that it is emerged at the upper surface of the substrate or it is embedded inside the substrate.

3. The memory card package structure according to claim 1, wherein a signal output unit is disposed on the lower surface of the substrate.

4. The memory card package structure according to claim 3, wherein the signal output unit comprises a plurality of gold fingers.

5. The memory card package structure according to claim 1, wherein the chip is an NFC chip or an RFID chip.

6. The memory card package structure according to claim 1, wherein the chip is electrically connected to the substrate via a plurality of gold wires or a plurality of bumps.

7. The memory card package structure according to claim 1, further comprising a plurality of holes penetrating the first magnetic waveguiding layer.

8. A method for fabricating a memory card package structure comprising the steps of:
   providing a substrate, wherein the substrate comprises an antenna module;

disposing a first magnetic waveguiding layer on an upper surface of the substrate such that the first magnetic waveguiding layer covers at least the antenna module;

disposing a chip on the first magnetic waveguiding layer and electrically connecting the chip with the substrate;

forming an encapsulation body encapsulating the chip, the first magnetic waveguiding layer and the upper surface of the substrate; and disposing a second magnetic waveguiding layer on a lower surface of the substrate, wherein the first magnetic waveguiding layer and the second magnetic waveguiding layer are disposed at positions such that they cover at least the location span of the antenna module.

9. The method for fabricating the memory card package structure according to claim 8, wherein the first magnetic waveguiding layer and the second magnetic waveguiding layer are formed on the substrate at the same time.

10. The method for fabricating the memory card package structure according to claim 8, wherein the first magnetic waveguiding layer and the second magnetic waveguiding layer are adhesively attached to the substrate.

\* \* \* \* \*